United States Patent
Berggren et al.

(10) Patent No.: US 9,508,840 B2
(45) Date of Patent: Nov. 29, 2016

(54) DIODE, USE THEREOF, AND A METHOD FOR PRODUCING THE SAME

(75) Inventors: Magnus Berggren, Vreta Kloster (SE); Xin Wang, Norrköping (SE); Mats Robertsson, Stockholm (SE); Petronella Norberg, Linköping (SE); Philip George Cooper, GB-Stockbridge (GB); Peter Andersson Ersman, Finspång (SE)

(73) Assignees: ACREO SWEDICH ICT AB, Kista (SE); DE LA RUE INTERNATIONAL LIMITED, Basingstoke (GB)

( * ) Notice: Subject to any disclaimer, the term of this patent is extended or adjusted under 35 U.S.C. 154(b) by 862 days.

(21) Appl. No.: 13/988,976

(22) PCT Filed: Nov. 22, 2011

(86) PCT No.: PCT/EP2011/070694
§ 371 (c)(1),
(2), (4) Date: May 22, 2013

(87) PCT Pub. No.: WO2012/069480
PCT Pub. Date: May 31, 2012

(65) Prior Publication Data
US 2013/0293031 A1 Nov. 7, 2013

Related U.S. Application Data

(60) Provisional application No. 61/416,447, filed on Nov. 23, 2010.

(30) Foreign Application Priority Data
Nov. 23, 2010 (EP) ..................................... 10192258

(51) Int. Cl.
*H01L 21/28* (2006.01)
*H01L 29/68* (2006.01)
(Continued)

(52) U.S. Cl.
CPC ............. *H01L 29/68* (2013.01); *G07D 7/0093* (2013.01); *H01L 21/28* (2013.01); *H01L 29/66143* (2013.01); *H01L 29/872* (2013.01); *H02J 17/00* (2013.01); *H01L 29/47* (2013.01)

(58) Field of Classification Search
CPC ..... H01L 29/68; H01L 21/28; H01L 29/872; H01L 29/66143; H01L 29/47; H02J 17/00; G07D 7/0093
See application file for complete search history.

(56) References Cited

U.S. PATENT DOCUMENTS

| 6,569,544 B1 | 5/2003 | Alain et al. |
| 2003/0178620 A1 | 9/2003 | Bernds et al. |

(Continued)

FOREIGN PATENT DOCUMENTS

| WO | WO 02/21612 | 3/2002 |
| WO | WO 2008/135502 | 11/2008 |

(Continued)

OTHER PUBLICATIONS

Taiwanese Office Action issued in co-pending Taiwan Patent Application No. 100142781, which has the same priority as the instant application, dated Aug. 13, 2015; 2 pgs.

(Continued)

*Primary Examiner* — Kyoung Lee
(74) *Attorney, Agent, or Firm* — Harness, Dickey & Pierce, P.L.C.

(57) ABSTRACT

High frequency currents may be rectified by means of a printable diode comprising a first and a second electrode, between which a semiconducting layer comprising semiconducting particles embedded in an inert matrix, and a conducting layer comprising conducting particles embedded in an inert matrix are arranged.

22 Claims, 3 Drawing Sheets

(51) Int. Cl.
G07D 7/00 (2016.01)
H01L 29/66 (2006.01)
H01L 29/872 (2006.01)
H02J 17/00 (2006.01)
H01L 29/47 (2006.01)

(56) References Cited

U.S. PATENT DOCUMENTS

| | | | |
|---|---|---|---|
| 2006/0154432 A1* | 7/2006 | Arai | H01L 29/8615 438/385 |
| 2006/0293426 A1 | 12/2006 | Curran et al. | |
| 2007/0096080 A1 | 5/2007 | Cain et al. | |
| 2010/0108978 A1 | 5/2010 | Venkatasamy et al. | |

FOREIGN PATENT DOCUMENTS

| WO | WO 2010/108978 | 9/2010 |
|---|---|---|
| WO | WO 2012/069480 | 5/2012 |

OTHER PUBLICATIONS

International Search Report from PCT Application No. PCT/EP2011/070694 (published as WO 2012/069480) dated Feb. 14, 2012; 4 pgs. The instant application is a national phase of PCT/EP2011/070694 (WO 2012/069480).

"The $TiO_2$ nanoparticle effect on the performance of a conducting polymer Schottky diode"; K.H. Yoo et al.; Nanotechnology, IOP, Bristol, GB, vol. 19, No. 50; Dec. 17, 2008; 5 pgs.

"Polymer diodes with high rectification"; L.S. Roman et al.; Applied Physics Letters, AIP, American Institute of Physics, Melville, NY, US, vol. 75, No. 22; Nov. 29, 1999; 3 pgs.

"Capacitance spectroscopy of CdTe self-assembled quantum dots embedded in ZnTe matrix"; E. Placzek-Popko et al.; Physica B., vol. 404, 2009; pp. 5173-5176.

* cited by examiner

DIODE, USE THEREOF, AND A METHOD FOR PRODUCING THE SAME

CROSS REFERENCE TO RELATED APPLICATIONS

This patent application is a U.S. national stage filing under 35 U.S.C. §371 of International Application No. PCT/EP2011/070694 filed Nov. 22, 2011 (published as WO 2012/069480 on May 31, 2012), which claims priority of European application No. 10192258.1 filed Nov. 23, 2010 and U.S. provisional patent application No. 61/416,447 filed Nov. 23, 2010. The disclosures of the applications identified in this paragraph are incorporated herein by reference in their entirety.

TECHNICAL FIELD

The invention relates to the field of diodes, and more particularly to diodes which may be manufactured by means of printing techniques.

BACKGROUND OF THE INVENTION

WO 2008/135502 describes a security device, which is used as a defense against copying and counterfeiting of articles such as bank notes, passports and authenticity documents.

In the above application a circuit is provided comprising an antenna, a rectifier and an EC-display, wherein the antenna is arranged to receive electromagnetic radiation from an external source and to convert it into electric energy. The rectifier is arranged to receive electric energy from said antenna and convert said energy to a rectified current. The electrochromic display is arranged to receive rectified current from said rectifier, and to alter its electrochromic state in response to said rectified current in order to indicate the authenticity of e.g. a security document. According to a preferred example, electromagnetic radiation from a mobile phone is used to active the security device.

There is a constant demand on lowering the manufacturing cost of security devices, especially when these are to be applied to low cost articles, such as bank notes. Thus, there is a demand for components which are printable and which may operate at high frequencies, such as at 0.4 GHz and above.

Previously the problem of rectifying high frequencies has been solved by conventional semiconductor devices like for example surface mounted device (SMT). However such devices are not printable. Today, the reported printable diodes (p-n diodes) have been shown to work up to about 10 MHz.

Lilja K. E. et al., 'Gravure printed organic rectifying diodes operating at high frequencies', Org. Electronics (2009), doi:10.1016/j.orgel.2009.04.008 describes diodes operating at common RFID frequencies, such as 10 MHz. The diodes comprise conducting layers comprising silver and copper, respectively, with an organic polymer layer sandwiched in between. However, this diode is not suitable for operation at frequencies of 0.4 GHz and above.

Thus, there is a need for a printable diode working at frequencies of 0.4 GHz and above. There is also a need for a manufacturing process facilitating large scale production of such diodes with cost effective methods.

SUMMARY OF THE INVENTION

Solutions meeting these needs are presented below. Although the background of the invention is presented from a security document point of view, the diode presented below may of course be used in many other applications where an alternating current, having a high or low frequency, is to be rectified.

According to one aspect thereof, the invention relates to a diode comprising:
  a first conductor and a second conductor;
  a semiconducting layer comprising semiconducting material at least partly embedded in an inert matrix, which semiconducting layer is arranged between said first conductor and said second conductor, and
  a conducting layer comprising conducting material at least partly embedded in an inert matrix, which conducting layer is arranged between said semiconducting layer and said second conductor;
wherein
said layers are stacked on top of each other in a first direction; and
the interface between said first conductor and said semiconducting layer provides a rectifying junction;
the interface between said conducting layer and said semiconducting layer provides a first junction; and
the interface between said second conductor and said conducting layer provides a second junction,
wherein the rectifying junction in operation provides a higher resistance under reversed bias, compared to the total resistance of the rectifying junction and the first and second junctions under forward bias.

According to one example, the rectifying junction provides a resistance under reversed bias which is at least 2 times higher compared to the total resistance of the rectifying junction and the first and second junctions under forward bias. According to other examples the rectifying junction provides a resistance under reversed bias which is at least 5 times higher or at least 10 times higher, respectively, compared to the total resistance of the rectifying junction and the first and second junctions under forward bias.

According to another aspect thereof, the invention relates to a diode comprising
  a first conductor and a second conductor;
  a semiconducting layer comprising semiconducting material at least partly embedded in an inert matrix, which semiconducting layer is arranged between said first conductor and said second conductor, and
  a conducting layer comprising conducting material at least partly embedded in an inert matrix, which conducting layer is arranged between said semiconducting layer and said second conductor;
wherein
said layers are stacked on top of each other in a first direction; and
the interface between said first conductor and said semiconducting layer provides a rectifying junction or a substantially rectifying junction;
the interface between said conducting layer and said semiconducting layer provides a first ohmic junction or a first substantially ohmic junction; and
the interface between said second conductor and said conducting layer provides a second ohmic junction or a second substantially ohmic junction.

In relation to this invention a semiconducting material is a material with electrical conductivity provided by electron flow, which conductivity is intermediate in magnitude between that of a conducting material and an insulator. This means a conductivity usually in the range of about $10^3$ to about $10^{-8}$ siemens per centimeter.

In relation to this invention, the term ohmic junction refers to the interface between two layers that allows carriers to flow easily in both directions over the junction. The two layers may e.g. be a conducting and a semiconducting layer, or two conducting layers. In an ideal ohmic junction the resistance of the junction has no effect on device performance. I.e. when operating a device comprising an ohmic junction there is no voltage drop over that junction. However, in real life, an ohmic junction normally has a small voltage drop or interface resistance. Such a non-ideal ohmic junction may also be referred to as a substantially ohmic junction. Consequently, for a rectifying component comprising at least two interfaces, wherein at least one of the interfaces is substantially ohmic and at least one is rectifying, the small voltage drop over the substantially ohmic junction is normally lower than 20%, preferably lower than 10%, more preferably lower than 5%, and even more preferably lower than 2% compared to the voltage drop over the rectifying junction, when the device is operating under reversed bias.

Further, in operation, the rectifying junction preferably provides a higher resistance under reversed bias, compared to the total resistance of the rectifying junction and the first and second substantially ohmic junctions under forward bias. Further, in operation and under reversed bias, the rectifying junction provides a higher resistance compared to the first and second substantially ohmic junctions.

In relation to this invention the expression lateral direction is used when referring to a direction which is parallel with a layer, i.e. parallel with two opposing surfaces of a layer, which surfaces have the largest surface area of that layer.

In relation to this invention the expression vertical direction is used when referring to a direction orthogonal to the lateral direction defined above.

In relation to this invention the expression that layers are stacked on top of each other in a first direction, or that the layers have a stacked configuration, or that the layers are arranged in a stacked configuration, means that the layers are arranged one on top of the other. In other words, none of the layers are arranged side by side.

In yet other words, there exist a cross-section taken in a direction normal to the layers which comprises all of the layers. Thus, there is a vertical cross-section, i.e. a cross-section taken in the vertical direction, which comprises both semiconducting material and conducting material.

According to a second aspect thereof, the invention relates to a method for manufacturing a diode comprising the following steps:
i) providing a first conductor layer;
ii) applying, on said first conductor layer, a first intermediate layer comprising a first material at least partly embedded in an inert matrix,
iii) solidifying the inert matrix of said second layer applied in step ii),
iv) applying, on said first intermediate layer, a second intermediate layer comprising a second material at least partly embedded in an inert matrix,
v) solidifying the inert matrix of said second intermediate layer applied in step iv).
vi) providing, on said second intermediate layer, a second conductor layer,
such that said layers are stacked on each other in a first direction,
wherein said first material is one of conducting material and semiconducting material, and
said second material is the one of conducting material and semiconducting material, which is different from said first material.

According to one embodiment, a first junction, or a first substantially ohmic junction, is provided by the interface between the intermediate layer comprising said conducting material and the intermediate layer comprising said semiconducting material. A second ohmic junction, or a second substantially ohmic junction, is provided by the interface between the intermediate layer comprising said conducting material and the most adjacent one of said first conductor and said second conductor. A rectifying junction is provided by the interface between the intermediate layer comprising said semiconducting material and the most adjacent one of said first conductor and said second conductor.

In more detail, for the case when said conducting material is applied in step ii); of said first and second conductor, the first conductor is the most adjacent one to said first intermediate layer. For the case where said conducting material is applied in step iv); of said first and second conductors, the second conductor is the most adjacent one to said second intermediate layer.

According to a third aspect thereof, the invention relates to a circuitry for application to an article comprising:
an antenna arranged to receive EM-radiation from an external source and to convert the EM-radiation into electric energy;
a diode arranged as described in relation to said first and second aspects and also arranged to receive electric energy from said antenna and convert said energy to a rectified current.

According to a fourth aspect thereof, the invention relates to an electric circuit comprising a diode arranged as described in relation to said first or second aspect.

According to a fifth aspect thereof, the invention relates to use of a diode arranged as described in relation to said first or second aspect in an electric circuit, and preferably in a printed electric circuit.

Embodiments and advantages of above stated aspects are discussed in more detail below.

According to one embodiment there is provided a diode comprising:
a first conductor and a second conductor;
a semiconducting layer comprising n-doped or p-doped silicon at least partly embedded in an inert matrix, which semiconducting layer is arranged between, or sandwiched between, said first conductor and said second conductor and in direct contact with said first conductor;
a silicide layer comprising silicide at least partly embedded in an inert matrix, which silicide layer is arranged or sandwiched between, and arranged in direct contact with, said semiconducting layer and said second conductor.

According to one embodiment there is provided a diode comprising:
(a) a first conductor;
(b) a semiconducting layer;
(c) a conducting layer;
(d) a second conductor;
said layers having a stacked configuration
wherein
said conducting layer is arranged between said first conductor and said second conductor layer,
said semiconducting layer is arranged between said second conductor and said conducting layer, the semiconducting layer comprises n-doped or p-doped silicon embedded in an inert matrix; and the conducting layer comprises metal silicide embedded in an inert matrix.

According to one embodiment there is provided a method for manufacturing a diode comprising the following steps:
i) providing a first conductor;
ii) applying, on said first conductor, a second layer comprising a first material in an inert matrix,
iii) solidifying the inert matrix of said second layer applied in step ii),
iv) applying, on said second layer, a third layer comprising a second material in an inert matrix,
v) solidifying the inert matrix of said third layer applied in step iv).
vi) providing, on said third layer, a fourth conducting layer, wherein said first material is one of silicide and silicon, and said second material is the one of silicide and silicon, which is different from said first material, and wherein said silicon is n-doped or p-doped.

Said first conductor, said second layer, said third layer and said fourth layer are preferably arranged in a stacked configuration.

According to one embodiment, both the semiconducting material and the conducting material are arranged in particulate form, i.e. the materials comprise particles.

Further, the particles are preferably arranged in contact with each other, so as to provide particle bridges in the inert matrix between the first conductor and the second conductor.

In relation to this invention when a first material is partly embedded in a second material, this means that a portion of the first material is only partly enclosed, or protrudes out of, the second material. In more detail, when the first material is in particulate form and partly embedded in the second material, this means that at least one of the particles is only partly enclosed in, or a portion of at least one particle protrudes out of, the second material. In more detail, when a first material is partly embedded in a second material, this means that the first material is not fully embedded in the second material.

In more detail, there is provided a diode comprising:
a first electrode layer and a second electrode layer arranged in parallel with each other;
a semiconducting layer, which is n-doped or p-doped and arranged in parallel with and spatially between said first electrode layer and said second electrode layer;
a conducting layer, which is arranged in parallel with and spatially between said conducting layer and said second electrode layer;
said semiconducting layer comprises particles of a semiconducting material, which particles are also referred to as semiconducting particles herein, which semiconducting particles are embedded in an inert matrix, and said conducting layer comprises particles of a conducting material, which particles are also referred to as conducting material particles herein, which conducting material particles are embedded in an inert matrix,
wherein a first portion of said semiconducting particles is in direct contact with said first electrode layer, a first portion of said conducting material particles is in direct contact with said second electrode layer, and a second portion of said semiconducting particles is in direct contact with a second portion of said conducting material particles; and
wherein a third portion of said semiconducting particles bridges said first portion of semiconducting particles and said second portion of semiconducting particles; and a third portion of said conducting material particles bridges said first portion of conducting material particles and said second portion of conducting material particles.

In this application the expressions first conductor and first electrode are used interchangeably, also the expressions second electrode and second conductor are used interchangeably.

In relation to this invention the expression that a first set of particles bridges a second and third sets of particles, means that the particles of said first set is in direct contact with each other and arranged such that a bridge between said second and third set of particles is formed. In more detail, the particles of said first set, which are in contact with each other, need not be arranged in a straight line but may have any arrangement as long as uninterrupted paths of particles between the second and third sets of particles are formed.

In relation to this invention the expression direct contact means direct physical contact (common interface) between two surfaces.

According to one embodiment both the semiconducting material and the conducting material are arranged in particulate form, and the semiconducting particles of said semiconducting layer are distributed such that the resistance across the semiconducting layer is lower in said first direction compared to in a second direction being orthogonal to said first direction; and/or
the conducting particles of said conducting layer are distributed such that the resistance across the conducting layer is lower in said first direction compared to a in a third direction being orthogonal to said first direction.

As stated above, the first direction is the direction along which the layers are stacked on top of each other; said second direction and said third direction are in-plane directions, which both are orthogonal to said first direction. Said third direction may be the same as, or different from, said second direction.

In relation to this invention the term "across a layer" means from one end of the layer to the opposite end of the layer usually along a given direction.

If the resistance across the semiconducting layer is lower in an "in-plane" direction compared to the vertical direction, there will be a substantial current distribution in the 'in-plane" direction. The same is true for the resistance across the conducting layer. Hence, if the resistance across the conducting layer is lower in an "in-plane" direction compared to the vertical direction, there will be a substantial current distribution in the 'in-plane" direction of that layer.

In relation to this invention the expression geometric diode area refers to a vertical projection of the first conductor, the semiconducting layer, the conducting layer and the second conductor, which projection results in "the least common area" of the stack. In other words, the diode area may be determined by first determining the overlap between the first conductor and the semiconducting layer, thereafter determining the overlap between the conducting layer and said second conductor, and finally determining the overlap between the first overlap and the second overlap in the vertical or first direction.

For a first case where:
the semiconducting layer extends outside the first conductor in at least a first direction, which first direction is orthogonal to said vertical direction,
the conducting layer extends outside the second conductor in at least a second direction, which second direction is orthogonal to said vertical direction,
the resistance across the semiconducting layer in said first direction is equal to resistance across the semiconducting layer in said vertical direction the resistance across the conducting layer in said first direction is equal to resistance across the conducting layer in said second direction;

the effective diode area is equal to the geometric diode are.

However, for a second case which is equal to said first case except that:

the resistance across the semiconducting layer in said first direction is substantially lower than resistance across the semiconducting layer in said vertical direction the resistance across the conducting layer in said first direction is substantially lower than resistance across the conducting layer in said second direction; the effective diode area is larger than the geometric diode are.

Further, for a third case which is equal to said first case except that:

the resistance across the semiconducting layer in said first direction is substantially higher than resistance across the semiconducting layer in said vertical direction the resistance across the conducting layer in said first direction is substantially higher than resistance across the conducting layer in said second direction; the effective diode area is smaller than the geometric diode are.

Due to varying resistance of the conducting layers and the semiconducting layers described in relation to said second and third cases, these layers may also be referred to as anisotropic layers.

In other words, if the resistance across both the semiconducting layer and the conducting layer is lower in an "in-plane" direction compared to the vertical direction, the effective diode area will be larger for this case compared to when the in-layer current distribution is more limited. When designing diode, a small effective diode area is preferred.

The resistance across a layer may be altered by adjusting the particle separation and/or the particle size in the layer. The fewer and the smaller the gaps between the particles across the layer in one direction, the lower the resistance across the layer in that direction. Additionally, the fewer the particle-to-particle interfaces, e.g. the larger the particles, across the layer in one direction; the lower the resistance across the layer in that direction. For a layer where the particle distribution is the same in the vertical and in the lateral direction, the resistance in the vertical direction is normally lower, as the extension of the layer is normally smaller in the vertical direction compared to the lateral direction. In other words, the layer is normally thin.

According to one example, the resistance across the semiconducting layer or the conducting layer is no more than 75% in the vertical direction compared to that in a lateral direction. According to another example the resistance across the semiconducting or the conducting layer at least twice as high in a lateral direction compared to the vertical direction, or at least 5 times as high, or at least 10 times as high, or at least 50 times as high, or at least 100 times as high in a lateral direction compared to the vertical direction.

Consequently, the size and distribution of said semiconducting particles and said conducting particles are preferably selected such that the resistance across the semiconducting layer is lower in said first direction compared to in a second direction being orthogonal to said first direction. In addition to what has been stated above, a higher resistance in an "in-plane" direction allows for printing of a diode having a small effective diode area, also when the resolution or precision of the printing equipment is limited.

Additionally or alternatively, the semiconducting particles of said semiconducting layer are distributed such that the resistance across the semiconducting layer is lower in said first direction compared to in both said second direction and said third direction or in all directions orthogonal to said first direction; and/or the conducting particles of said conducting layer are distributed such that the resistance across the conducting layer is lower in said first direction compared to in both said second direction and said third direction or in all directions orthogonal to said first direction. Said second direction and said third direction being orthogonal to said first direction, and said first direction being equal to the vertical direction of said layers.

According to one example, the printing equipment for producing the diode allows for printing of narrow conductors, but the printing resolution of the inert matrix is more limited. According to another example, the printing equipment for producing the diode allows for printing of conductors and inert matrixes, having a width of about 100 µm, but the precision of the printing equipment is also about +/−100 µm. Hence in order to make sure that a first and a second layer printed on top of each other actually overlaps; the width of at least one of the layers is set to 300 µm. However, a smaller effective diode area may still be achieved, by arranging the intermediate layers such that resistance of each of the intermediate layers is lower in the vertical direction compared to a lateral direction, explained in more detail above. Moreover, the effective diode area may be further decreased by arranging the first and the second conductor such that they cross each other at a point of intersection, and arranging the anisotropic intermediate layers between said first and second conductors at the point of intersection.

In other words, the first conductor and the second conductor may cross each other at an intersection, and the semiconductor layer and the conducting layer are arranged spatially between the first conductor and the second conductor at said intersection.

In more detail, in a diode comprising two anisotropic layers, i.e. having different resistances in different directions, said first conductor overlaps said semiconducting layer, and the semiconducting may layer extend, at least along a portion of said first conductor, outside said first conductor in the lateral direction, and may preferably extend outside said first conductor in said second direction along the entire overlap between the first conductor and the semiconducting layer. Further said second conductor overlaps said conducting layer, and the conducting layer may extend, at least along a portion of said second conductor, outside said second conductor in a lateral direction, and may preferably extend outside said second conductor in said third direction along the entire overlap between the second conductor and the conducting layer.

According to one embodiment, there is provided a security document circuitry comprising:

an antenna arranged to receive EM-radiation from an external source and to convert the EM-radiation into electric energy;

a diode arranged as described in relation to said first and second aspects, and further arranged to receive electric energy from said antenna and convert said energy to a rectified current; and an electrochromic display arranged to receive rectified current from said rectifier, and to alter its electrochromic state in response to said rectified current in order to indicate the authenticity of a security document.

According to one embodiment particles of the semiconducting material, also referred to as semiconducting particles herein, are arranged in contact with each other in a substantially vertical direction in the semiconducting layer, and/or particle of the conducting material, also referred to as conducting material particles herein, are arranged in contact with each other at least in a substantial vertical direction in said conducting layer. That the particles are in contact with each other in a substantial vertical direction in the diode is advantageous, as this gives a higher vertical conductivity across the respective layer.

According to one embodiment, said semiconducting material is not in direct contact with said second conductor, and/or said conducting material is not in direct contact with said first conductor.

The material of said semiconducting layer is preferably selected such that a rectifying junction is formed as a barrier in the interface between the first conductor and the semiconducting layer. Further, the material of said conducting layer is preferably selected such that a junction or a substantially ohmic junction is formed in the interface between the semiconducting layer and the conducting layer. Preferably, the conducting layer provides a low contact resistance to the semiconductor as well as to the second conductor, as this improves the properties of the diode. In other words, the resistance in the junction between the conducting layer and the second conductor shall preferably be kept as low as possible.

In more detail, a metal semiconductor junction may form a rectifying interface. This rectifying interface normally results in both fast switching and low forward voltage drop. In comparison with a p-n junction (formed by a semiconductor-semiconductor junction), there is normally also a difference in e.g. the reverse recovery time, when the diode switches from non-conducting to conducting state and vice versa. Whereas for the p-n diode the reverse recovery time can be in the order of hundreds of nanoseconds, rectifying diodes usually do not have a recovery time as there is nothing to recover from.

According to theory, a metal-semiconductor junction results in an ideal ohmic junction (i.e. a contact or junction with voltage independent resistance) if the Schottky barrier height, $f_B$, is zero or negative. In such case, the carriers are free to flow in or out of the semiconductor so that there is a minimal resistance across the contact or junction. For an n-type semiconductor, this means that the workfunction of the metal is preferably close to or smaller than the electron affinity of the semiconductor. For a p-type semiconductor, it requires that the workfunction of the metal is preferably close to or larger than the sum of the electron affinity and the bandgap energy.

As stated above, in operation, the rectifying junction preferably provides a higher resistance under reversed bias, compared to the total resistance of the rectifying junction and the first and second ohmic junctions under forward bias. Moreover, in operation and under reversed bias, the rectifying junction preferably provides a higher resistance compared to the first and second ohmic junctions.

The semiconductor can be of elements selected from group IV or III, optionally in mixture with elements selected from group V. Examples of the semiconducting material are Si, Ge, AlN, AlP, AlAs, GaN, GaP, GaAs, InN, InP and InAs.

The conducting material may be selected from silicides and elements of groups I, III, IV, and VI, optionally in mixture with elements of groups I, II, III, IV, V, VI. The silicides may be selected from metal silicides, and the metal silicides may be selected from the group consisting of $NbSi_2$, $TiSi_2$, $CoSi_2$, $WSi_2$, $NiSi_2$, $NiSi$, $FeSi_2$, $TaSi_2$, $VSi_2$, or mixtures thereof. Examples of elements of groups I, III, IV, and VI, optionally in mixture with elements of groups I, II, III, IV, V, VI are Si, Au, Al, Mo, W, In, AuSn, AuSb, AuGe, AuSi, AuSn, AuTe, AuZn, AlIn, GaAg, InTe, InAu, AgSn, SnTe, According to one example the semiconducting material comprises n-doped or p-doped silicon, and the conducting material comprises silicide In more detail, table 1 presents suitable pairs of semiconducting material and conducting materials, as well as the preferred doping of the semiconducting material. The first column in the table suggests to use a silicide as conducting material, and n- or p-doped silicon as semiconductor material. The last column suggests to use Sn—Te as conducting material, and n-doped InSb as semiconductor material. The "–" sign indicates that the relation between the two materials is not necessarily stoiciometric. I.e. Au—Sn should be read as Au and Sn not necessary stoiciometric, as opposed to AuSn where there is 1:1 relation between Au and Sn atoms.

TABLE 1

Suitable pairs of conducting materials and semiconductor materials

| Conducting material | Silicides | Au—Sn | Au—Sb | Au—Sb | Si | Al, Al—In | | Mo, W | Ga—Ag |
|---|---|---|---|---|---|---|---|---|---|
| Semiconductor material | Si | Si | Si | Ge | AlN | AlN | | AlN | AlP |
| Doping property | n, p | n | n | n, p | | | | | N |
| Conducting material | In—Te | Au | Au—Ge | Au—Sn | Al—In | Au—Zn | Au—Ge | Au—Sn | Au—Si |
| Semiconductor material | AlAs | AlAs | AlAs | AlAs | GaN | GaP | GaP | GaP | GaP |
| Doping property | n, p | n, p | n, p | N | | p | p | n | n |
| Conducting material | Au—Zn | In—Au | Au—Ge | In—Au | Au—Si | Au—Sn | Au—Te | In | In |
| Semiconductor material | GaAs | GaAs | GaAs | GaAs | GaAs | GaAs | GaAs | GaSb | GaSb |
| Doping property | P | p | n | N | n | n | n | p | n |

TABLE 1-continued

Suitable pairs of conducting materials and semiconductor materials

| Conducting material | In | In, In—Te | Ag—Sn | Sn—Te | In | In | Sn—Te | C |
|---|---|---|---|---|---|---|---|---|
| Semiconductor material | InP | InP | InP | InAs | InAs | InSb | InSb | Si |
| Doping property | P | n | n | N | n | n | n | n, p |

According to one embodiment the conducting material is arranged in particulate form, and preferably a particulate form having a particle size of about 30 nm to about 20 μm, and more preferably a particle size of about 1 μm to about 10 μm. In relation to this invention all particle sizes are given as mean particle diameters, unless stated otherwise.

According to one embodiment the semiconducting material is arranged in particulate form, and preferably a particulate form having a particle size of about 30 nm to about 20 μm, and more preferably a particle size of about 1 μm to about 10 μm.

According to one embodiment, the first conductor comprises metal. Further the first conductor may be selected from a group consisting of Al, Ag, Cu or combinations thereof. The thickness of the first conductor may be between about 50 nm to about 15 μm.

According to one embodiment, the second conductor comprises metal, carbon or electrically conductive polymers or combinations thereof, in more detail second conductor may comprise Au, Pedot:PSS, Ag or combination thereof. The thickness of the first conductor may be between about 50 nm to about 15 μm.

The second conductor may e.g. be a combination of carbon and Ag. According to one example the second conductor is formed by a carbon layer, which is arranged in contact with the conducting layer, and a silver layer arranged as a silver line is in contact with the carbon layer, such that the carbon layer is arranged between the silver line and the conducting layer. This combination is advantageous e.g. for the embodiments where the carbon layer provides a better contact to the conducting layer compared to a silver layer, whereas the conductivity of the silver layer is higher compared to the carbon layer.

The surface roughness of the first conductor facing the semiconducting layer is preferably in the same order as of the materials added in particulate form in semiconducting layer and in the conducting layer. In more detail, the height of the surface roughness of the first conductor is preferably in the same order as the mean radius of semiconducting particles and the conducting material particles. The thinner the semiconducting particle layer of the semiconducting layer, it may e.g. be a few particle layers, and/or the smaller the size of the semiconducting particles, the lower the preferred surface roughness of the first conductor. However, if topography of the first conductor is in the same order as the semiconducting layer thickness, it may penetrate the next particle layer and reach through to the second conductor, which might short circuit the diode.

According to one embodiment, the semiconducting material particle size is substantially equal to the coarseness or the surface roughness of the first conductor, and/or the conducting material particle size is substantially equal to the coarseness or the surface roughness of the second conductor.

By analogy, what has been stated above for e.g. the relation between the surface roughness of the first conductor, and the size of the semiconducting layer and the semiconducting particles, are also true for the relation between the surface roughness of the second conductor, and the size of the conducting material layer and the conducting material particles. Thus, the surface roughness of the second conductor facing the conducting layer is preferably in the same order or smaller as the size of the materials added in particulate form in semiconducting layer and in the conducting layer, such that short circuit is prevented.

According to one embodiment, the conducting layer may be selected from carbon, Au, Ag or combinations thereof.

According to one embodiment the semiconducting material is p-doped silicon, wherein the silicon is doped to a degree of 500 μOhm cm to 2 Ohm cm, or to a degree of 0.001 Ohm cm to 0.2 Ohm cm, or to a degree of 0.01 to 0.02 Ohm cm.

According to one example the semiconducting layer preferably comprises n-doped silicon. The silicon may be doped with, for example, antimony or group V elements such as V, Nb and Ta. The n-doped Si is preferably doped to a degree of between about 500 μOhm cm to 2 Ohm cm, or to a degree of 0.001 Ohm cm to 0.2 Ohm cm, or to a degree of 0.01 to 0.02 Ohm cm.

The level of n-doping of the Si has an effect on rectification and internal diode resistance, i.e. the current flow through the diode. If lower level of doping of the silicon is used, the resistance will be higher, which result in smaller current through the diode. However, lower level of doping on the other hand gives a better rectification of the current. The semiconducting material is preferably selected by considering its mobility and its resistance.

The inert matrix is preferably an insulating matrix having a low dielectric constant. This is advantageous as a lower dielectric constant normally lowers the parasitic capacitances in the diode. Further, the inert matrix is preferably rigid, such that it substantially fixes the particles in the layer. The inert matrix of the semiconducting layer may be the same as, or different from, the semiconducting layer of the conducting layer.

The inert matrix material is preferably not itself conductive, it embeds the inorganic particles deposited in their solid state. In other words, the particles are at least partly embedded in the inert matrix.

The inert matrix is preferably a crosslinking polymer which may, after curing, preserve its form and size. Phenomenon like shrinking is advantageously avoided. The inert matrix shall preferably be crosslinked into a stable three-dimensional network.

Depending on the polymer selected for the inert matrix the curing of the inert matrix may be a self-curing process, for example initiated by UV radiation of at least a portion of the inert matrix. This may be an advantage when the construction of the diode or the complete electric circuit including the diode makes it difficult to perform a complete UV radiation of the complete inert matrix.

It is also an advantage if the inert matrix keeps its initial form and shape during solidifying, whereby the mobility of the embedded particles is rendered difficult or substantially prevented. This is especially important when external forces are applied on the diode layers, for example during manufacturing by a reel-to-reel process. However, the inert matrix may slightly change its form and shape during the curing, e.g. when a solvent is removed from the inert matrix.

Crosslinking polymers having the property to form matrix may be selected from acrylates, polyurethanes, silicons or from dielectric synthetic plastics.

In other words, the inert matrix may be selected from acrylates, polyurethanes, silicons, or the inert matrix may be selected from a group comprising epoxy resins, polyalkylenes, or mixtures thereof. In more detail the inert matrix may be selected from a group comprising polyethylene or polypropylene resins, polystyrenes, polyurethanes, polyimides, polybenzoxazoles, polythiazoles, polyethers, polyether ketones, polyacrylates, polyerephtalates, polyethylene naphthalate, polycarbonates, or mixtures thereof. The list of inert matrix materials is not exhaustive. According to one specific example the epoxy resin is SU-8, for example SU-8 2050.

Epoxy resins have shown properties which are advantageous in the diode of the present invention, these are properties like mechanical strength and durability properties.

The SU-8 product comprises epoxy resins (25-75%), cyclopentanone (23-78%), mixed tiarylsulfonium/hexafluoroantimonate salt (1-5%) and propylene carbonate 1-5%. The epoxy resin included in the SU-8 is further described by its structure formula:

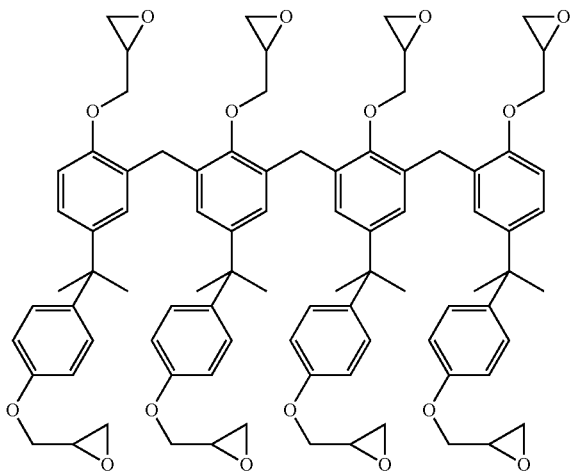 [SMILES: CC(C)(c1ccc(OCC2CO2)cc1)c1ccc(OCC2CO2)c(Cc2cc(C(C)(C)c3ccc(OCC4CO4)cc3)cc(Cc3cc(C(C)(C)c4ccc(OCC5CO5)cc4)cc(Cc4cc(C(C)(C)c5ccc(OCC6CO6)cc5)ccc4OCC4CO4)c3OCC3CO3)c2OCC2CO2)c1]

The conducting layer preferably comprises metal silicides embedded into the inert matrix. Preferably, $NbSi_2$ is selected as semiconductor material. The sizes of the particles are in the range 30 nm to 20 μm The invention resides in an insight by the inventors, that by properly selecting a combination of parameters a printable high quality diode working also at high frequencies, i.e. frequencies of at least 0.4 GHz, and preferably of at least 0.5 GHz and most preferably of at least 2.0 GHz, may be provided. Further, the diode may be arranged to rectify an alternating current having a frequency of between 0.4 GHz and 5 GHz, or between 0.4 GHz and 3 GHz, or between 1 GHz and 3 GHz, or between 1.5 GHz and 2.5 GHz.

These parameters include:
the degree of doping of the semiconducting material; the higher the degree of doping the better the conductivity and the lower the resistivity of the semiconducting layer, but the poorer rectifying properties of the semiconducting layer. When a high current out-put is desired, a higher degree of doping is preferably used, the balance between the particle size and the thickness of the inert matrix; the thinner the semiconducting layer and the conducting layer the lower the capacitance and the lower the resistance of the diode and thus the higher the frequencies that may be rectified by the diode, but the layer thickness of said semiconducting layer is preferably selected such that direct contact between the first conductor and the conducting material is prevented, and the layer thickness of said conducting layer is preferably selected such that direct contact between the second conductor and the semiconducting material is prevented. If conducting particles of the semiconducting layer are in direct contact with the second conductor, or if conducting particles of the conducting layer are in direct contact with the first conductor there is a risk of short circuit of the diode, the distribution of the particles; preferably, the semiconducting particles and conducting material particles provide a high conductivity in the vertical direction of said layer, and optionally higher resistance in the lateral direction the diode area; the smaller the diode area the lower the capacitance of the diode and the higher the frequencies that may be rectified by the diode;

the dielectric constant of the inert matrix, the lower the dielectric constant the lower the capacitance of the diode and the higher the frequencies that may be rectified by the diode;

the movability of the particles in the inert matrix; before and during the curing of the polymer of the inert matrix the particles or grains may be movable. If not complete curing of the polymer matrix is achieved, such movement may occur also afterwards which may affect the performance of the diode. However, the movability of the particles is a trade off between the performance of the diode and e.g. the manufacturing time of the diode.

There are a large variety of sizes, shapes and orientations in which the different layers may be provided. To minimize or optimize the diode area the semiconducting layer and first, second and second conductors may be elongated and arranged in a crosswise fashion. As explained above, the diode area is limited by the vertical projection of the overlap between the layers. In one embodiment the first conductor and the second conductor are arranged in a cross, the diode area is then determined by the crossing area or the interface between the two layers.

According to one embodiment, the diode area is limited by one or more insulating layers arranged between two adjacent layers in the diode, wherein the insulating material is provided with openings defining the area of the diode.

The different layers of the diode are preferably arranged adjacent and in contact with each other. By that there is provided contact between the different components in the layers to guarantee transfer of the current.

According to one example a very thin semiconducting layer is applied onto the first conductor. Measured from a particle perspective, the thickness of the semiconducting layer may be constituted of only a few semiconducting particles. An advantage achieved with this is minimization of the internal diode resistance and capacitance.

The diode may be applied to a substrate or carrier which may be flexible of rigid. It is possible for any material to which a diode/semiconducting layer can be permanently applied to be used as substrate material or carrier material for manufacturing the diode. There are many examples of such material, for example insulators such as paper, plastics, ceramics, glass, silica gel plates, textiles or card board.

In one embodiment of the invention, the substrate may be flexible, which is to be interpreted as any material which may be bent such that it has a radius of curvature suitable for reel-to-reel manufacturing methods. This is advantageous as it enables a use of roll-to-roll printing techniques.

According to another embodiment of the invention the substrate is rigid and non-flexible. These diodes may be manufactured by printing methods like screen printing, inkjet printing, flexographic printing, gravure printing, letterpress printing and aerosol jet printing.

The diode may further comprise an encapsulating layer for sealing and protecting said diode from humidity ambient substances and wear protection. Preferably, the encapsulating layer is made of a material which is durable, and even more preferred the encapsulating layer is made of a durable, transparent material, such as a plastic over-laminate or a printed varnish layer. Further, encapsulating layer may be a polymer film or any other isolating layer that may be applied by lamination or printing.

According to one aspect of the invention there is provided a diode comprising:
a) optionally a flexible carrier or substrate for the said diode
b) a first conductor comprising Al;
c) a semiconducting layer comprising n-doped Si in particulate form having a particle size of about 1 µm to about 10 µm;
d) a conducting layer comprising $NbSi_2$ in particulate form having a particle size of about 1 µm to about 10 µm;
e) a second conductor comprising a silver layer arranged in contact with a carbon layer, the carbon layer being in contact with the conducting layer;
f) optionally, an encapsulating layer sealing said diode
Method By the present invention also a method for manufacturing high frequency diodes is provided. Preferably, this method is performed by means of printing techniques. In relation to this invention, printing should be interpreted as any non-manual method of applying the semiconductor powder onto the substrate. Such methods include, but are not limited to, any standard printing method, for example, screen printing, inkjet printing, flexographic printing, gravure printing and letterpress printing. By using a reel-to-reel arrangement and a suitable printing method, the diodes can be printed with high spatial accuracy in a continuous manufacturing process.

In addition to what has been stated above with respect to the methods for manufacturing a diode, and more specifically with respect to the second aspect of the invention (which for reasons of convenience is repeated here), follows below examples of useful embodiments.

According to a second aspect thereof, the invention relates to a method for manufacturing a diode comprising the following steps:
i) providing a first conductor;
ii) applying, on said first conductor, a second layer comprising a first material in an inert matrix,
iii) solidifying the inert matrix of said second layer applied in step ii),
iv) applying, on said second layer, a third layer comprising a second material in an inert matrix,
v) solidifying the inert matrix of said third layer applied in step iv).
vi) providing, on said third layer, a fourth conducting layer, wherein said first material is one of conducting material and semiconducting material, and
said second material is the one of conducting material and semiconducting material,
which is different from said first material, and wherein said semiconducting material provides a substantially ohmic contact to the most adjacent one of said first conductor and said fourth conducting layer.

According to one embodiment, the step of applying said second layer and/or the step of solidifying said second layer is repeated one, two or several times before the step of applying said third layer is performed, and/or
the step of applying said third layer and/or solidifying said third layer is repeated one, two or several times before the step of applying said fourth conducting layer is performed.

According to one embodiment, the step of applying said third layer comprises the step of applying said third layer on top of both said first conductor and said second layer, and wherein said step of applying a fourth conducting layer preferably comprises the step of applying said fourth conducting layer on top of all of said first conductor, said second layer and said third layer.

In relation to this invention, that a first layer is arranged on a second layer, and a third layer thereafter arranged on top of both said first and second layers, does not necessarily imply that the third layer is in direct contact with both the first and second layer, but it does mean that the second layer is arranged spatially between said first layer and said third layer.

According to one example, said first material is in particulate form and said step of applying said second layer comprises the steps of:
  arranging said first material in said inert matrix such that a portion of said particles is in direct contact with said first layer, and/or such that a portion of said particles are only partly embedded in said inert material, and/or
said second material is in particulate form and said step of applying said third layer comprises the step of:
  arranging said second material in said inert matrix such that a portion of said particles is in direct contact with said second layer, and/or such that a portion of said particles are only partly embedded in said inert material.

According to one example the step of applying said second layer, comprises the steps of:
  applying said inert matrix on top of said first conductor;
  providing said first material on the surface of said applied inert matrix; and
  pressing said first material into said inert matrix by means of a pressuring device,
such that said first material is at least partly embedded by said inert matrix and/or
wherein the step of applying said third layer, comprises the steps of:
  applying said inert matrix of said third layer on top of said second layer;
  providing said second material on the surface of said applied inert matrix; and
  pressing said second material into said inert matrix by means of a pressuring device, such that said first material is at least partly embedded by said inert matrix.

According to a more detailed example, a first conductor is printed on a substrate. Thereafter a first inert matrix is applied onto the first conductor and covering a desired area of the first conductor. This is followed by the application of semiconducting particles in powder form or in particulate form, on top of the inert matrix. Optionally, the inert matrix is arranged such that the semiconducting particles will stick to the areas of the first conductor. The particles are distributed in the inert matrix directly due to the properties of the inert matrix, or by applying a pressure to the particles.

Thereafter, a second inert matrix is applied on top of the first inert matrix covering a desired area of the first inert matrix. This is followed by the application of conducting material particles in powder form or in particulate form, on top of the second inert matrix. Optionally, the second inert matrix is arranged such that the conducting material particles will stick to the areas of the first conductor. The particles are distributed in the second inert matrix directly due to the properties of the inert matrix, or by applying a pressure to the particles. This results in the semiconducting particles being at least partly embedded in the first inert matrix, and the conducting material particles being at least partly embedded in the second inert matrix. Thereafter, a second conductor is applied covering a desired area of the second inert matrix.

Preferably, the inert matrix adheres to the adjacent layers, and shows form stability.

In an alternative embodiment, the layers are applied in reverse order, starting with the second conductor and ending with the first conductor.

When pressure is used for providing the particles into the inert matrix, the inert matrix is preferably arranged to stand this pressure during the manufacturing process.

In the following the term underlying layer refers to the layer on top of which the inert matrix is to be arranged.

Another way to apply the semiconducting layer is to mix the inert matrix material and the semiconducting particles or the conducting material particles, before applying the resulting mixture onto the underlying layer.

An alternative way to apply the semiconducting particles or conducting material particles is to first arrange an insulating material comprising openings on the underlying layer and thereafter to apply, by e.g. printing, the semiconducting particles onto the underlying layer, through the openings of the insulating material.

Additionally or alternatively, inert matrix material having low viscosity is applied to the underlying layer, which allows the inert matrix material to sufficiently penetrate and fill up cavities and irregularities of the underlying layer. Further, an inert matrix material having low viscosity may also allow the semiconducting particles or conducting material particles to penetrate the inert matrix material to a desired degree.

According to one embodiment the step of applying said first or second inert matrix, including the step of applying the semiconducting particles or the conducting material particles is performed one, two or several times.

In other words, more than one layer of inert matrices and/or semiconducting particles and/or conducting material particles may be applied.

The semiconducting layer may be applied in powder form. Powdered semiconducting materiel may be obtained e.g. by grinding a conventional semiconductor wafer into a crystalline powder. The grinding may be performed by conventional techniques, for example by ball milling or planetary grinding. Alternatively, the semiconductor powder can be obtained by growth of separate crystals, by gas phase synthesis or plasma evaporation.

Each layer of inert matrix comprising conducting material particles or semiconducting particle is solidified, to prevent the particles from moving and being displaced in the respective inert matrix. During solidifying the positions of the particles should preferably be substantially unchanged, such that the interfaces between the layers are unaffected, as a displacement of the particles may affect the conductivity of the device.

The step of solidifying the inert matrix is preferably performed after each application of semiconducting particles or conducting material particles. The solidifying may be performed by conventional techniques, for example by thermal treatment, IR- or UV-radiation.

Further, the diode according to the present invention may be manufactured by methods wherein the temperature can be kept low, for example at temperatures below 100° C., advantageous when the diode comprises temperature sensitive materials. However, when it is desired to accelerate the process for solidifying the inert matrix, this is easily performed by raising the temperature. For example, forced termination of the solidifying process may be performed by raising the temperature for example up to 110° C., or up to 140° C., or up to 150° C., this may increase the efficiency when producing the diodes.

According to one example, the solidifying of the inert matrix is performed by curing by UV-radiation, optionally in combination with thermal treatment.

Applications

According to one example, the diode is arranged in a circuitry for application to an article, such as a security document, a smart packaging, an advertising material, a game, a toy, or other functional devices. In more detail the circuitry comprises:

an antenna arranged to receive EM-radiation from an external source and to convert the EM-radiation into electric energy;

a diode arranged as described in relation to said first and second aspects arranged to receive electric energy from said antenna and convert said energy to a rectified current; and optionally an indicating device arranged to alter its state in response to said rectified current.

According to one embodiment, said indicating device is a display or a light source, Examples of suitable displays are electrochromic displays, electrophoretic displays, plasma displays, e-Ink displays, LCD-displays, LED-displays, OLED-displays, the list is not exhaustive. Examples of light sources are LEDs and OLEDs. In more detail, the display or light source may be arranged to receive rectified current from said rectifier, and to alter its display state in response to said rectified current.

According to one example, the diode in the circuitry is arranged to receive and rectify EM-radiation emitted from a wireless device, preferably a portable and/or handheld wireless device, more preferably a handheld wireless communication device, most preferably a PDA, notebook, electronic reading pad or a mobile telephone, the list is not exhaustive.

According to one embodiment there is provided a security document comprising a circuit with a diode arranged as described herein.

In relation to this invention the term security document comprises banknotes, travellers cheques, bonds, share certificates, ID cards, ATM cards, passports, security passes, tickets, certificates of authenticity, security labels and brand protection articles such as labels, hang tags, swing tags, tear tapes or secure packaging for the purpose of protecting pharmaceutical good, high value luxury goods, fast moving consumer goods, sportswear, fashion garments and the like. The list is not exhaustive. A specific example is ePassports, which contain an IC chip wherein personal information such as name, nationality, date of birth and biometric information can be stored. The security document may serve as an additional security feature in addition to the IC chip in the ePassport.

The diode may be used in electric circuits, such as the security document circuitry described in detail in WO 2008/135502, which document is hereby incorporated by reference.

According to one embodiment, the security document circuitry is arranged to receive and rectify EM-radiation emitted from a wireless device, preferably handheld wireless device, more preferably a handheld wireless communication device, most preferably a PDA or a mobile phone.

According to one embodiment, the diode of the security document circuitry is arranged to rectify an alternating current having a frequency of between 0.4 GHz and 5 GHz, or between 0.4 GHz and 3 GHz, or between 1 GHz and 3 GHz, or between 1.5 GHz and 2.5 GHz.

The diode of the invention may then be incorporated together with components like antenna and display. The antenna will harvest the electromagnetic radiation from for example a mobile telephone or other hand held electromagnetic radiating equipment.

According to one example the diode is thin, below 100 μm, preferably in the range 10-30 μm such that it can easily be integrated with a thin security document, such as a bank note.

Preferably, the antenna is made of the same material as the first conductor. In an embodiment of the invention the antenna and the first conducting material are of aluminum (Al). If the material of the antenna is the same as of the first conductor these two components are preferably printed together onto the substrate.

In summary, there is provided a printable diode for rectifying high frequency currents comprising a first and a second electrode, between which a semiconducting layer comprising semiconducting particles embedded in an inert matrix, and a conducting layer comprising conducting particles embedded in an inert matrix are arranged. The layers and the electrodes are normally arranged in parallel with each other.

Generally, all terms used in the claims are to be interpreted according to their ordinary meaning in the technical field, unless explicitly defined otherwise herein. All references to "a/an/the [element, device, component, means, step, etc]" are to be interpreted openly as referring to at least one instance of said element, device, component, means, step, etc., unless explicitly stated otherwise. Other objectives, features and advantages of the present invention will appear from the following detailed disclosure, from the attached dependent claims as well as from the drawings. Preferred embodiments will now be described, by way of example only, with reference to the accompanying drawings.

BRIEF DESCRIPTION OF THE DRAWINGS

FIG. 4b is a log-lin diagram of the same measurements as presented in FIG. 4a.

DETAILED DESCRIPTION OF THE DRAWINGS

Figure 1:
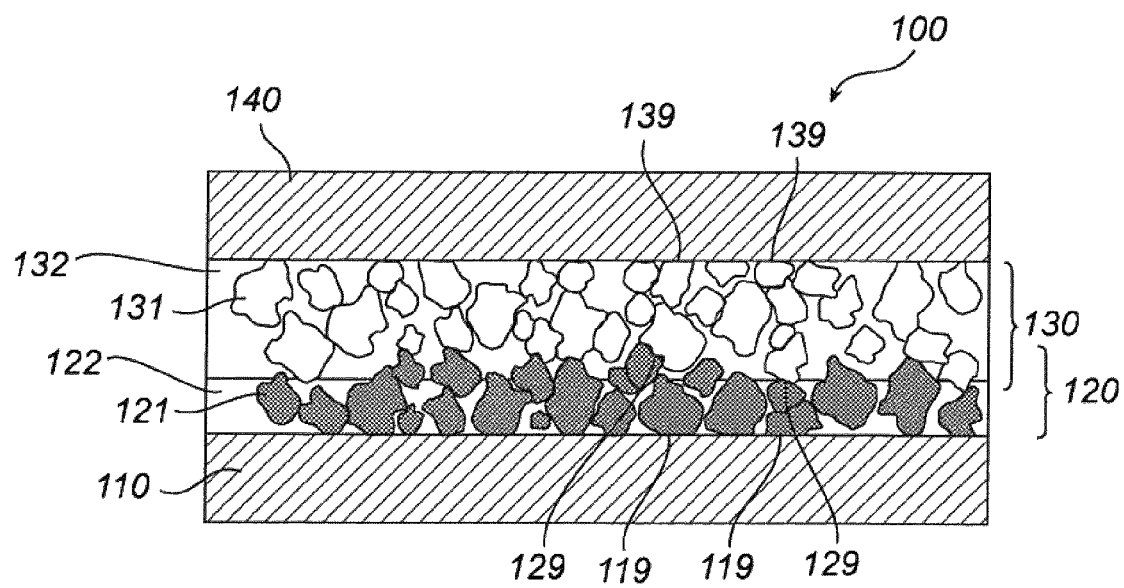
FIG. 1 is a schematic cross-section of a diode according to the invention.

FIG. 1 shows a schematic cross section of a diode comprising a first conductor 110, a semiconducting layer 120, a conducting layer 130, second conductor 140.

In more detail, the first conductor 110 comprises aluminum;
the semiconducting layer 120 comprises semiconducting particles 121, such as n-doped silicon 121 in powder form embedded in the inert matrix 122;
the conducting layer 130 comprises conducting material particles 131, such as $NbSi_2$ in powder form, embedded in the inert matrix 132; and
the second conductor 140 comprises carbon and silver, wherein the carbon is arranged as a layer in contact with the conducting layer and the silver is arranged as a more narrow layer on top of the carbon layer.

Further, a portion of the semiconducting particles 121 are arranged in direct contact with each other, so as to provide particle bridges in the inert matrix from the first conductor 110 to the conducting layer 130, and a portion of the conducting material particles 131 are arranged in direct contact with each other, so as to provide particle bridges in the inert matrix from the semiconducting layer 120 to the second conductor 140. As can be seen in FIG. 1, the particles are not necessarily arranged on top of each other in a straight line, but the particle bridges extend in a substantially vertical direction between the layers. Moreover, a portion of the semiconducting particles 121 are in direct contact with a portion of the conducting material particles 131 in order to provide a desired electrical conductivity between the layers 120, 130. Additionally, a portion of the particles of the semiconducting layer 120 is only partly embedded in the inert matrix 122 of the semiconducting layer 120, but protrudes into the inert matrix 132 of the conducting layer 130. This is advantageous as it facilitates the arrangement of the semiconducting particles 121 in contact with the conducting material particles 131.

Experimental Description of the Invention

Diodes according to the invention were produced according to the following method.

The first conductor was of Al.
The first conductor (the bottom electrode) was patterned in lines of four different widths, 50 μm, 75 μm, 100 μm and 200 μm.

The printed diodes consist of 6 materials deposited in separating steps on the Al electrode:
Step 1: Depositing inert matrix comprising SU-8 by ink-jet printing (0.5-6 μm, dry). The inert matrix, SU-8 2050, was diluted with solvent (cyclopentanone) until its viscosity was suitable for the deposition method of choice.
Step 2: Depositing the n-doped Si-particles (median particle size about 3 μm, achieved by ball milling) by screen printing.
 a) particles were pressed into the SU-8 layer by passing the substrate sheet between rolls;
 b) UV curing of SU-8;
 c) thermal curing of SU-8;
Step 3: Depositing inert matrix comprising SU-8 by ink-jet printing (thickness 0.5 μm);

Step 4: Depositing the metal silicide (NbSi$_2$) by screen printing;
- a) particles were pressed through the SU-8 layer by passing the substrate sheet between rolls;
- b) UV curing of SU-8;
- c) thermal curing of SU-8;

Step 5: Depositing the second conductor
- a) depositing the carbon (ink) by screen printing, thickness 10 μm
  the layer was thermal cured by heating (according to manufacturers specification)
- b) depositing the Ag(s) by screen printing, thickness 10 μm
  the layer was thermal cured by heating (according to manufacturers specification)

The resistivity of the silicon was specified to be 0.01-0.02 Ohm cm.

Figure 2:
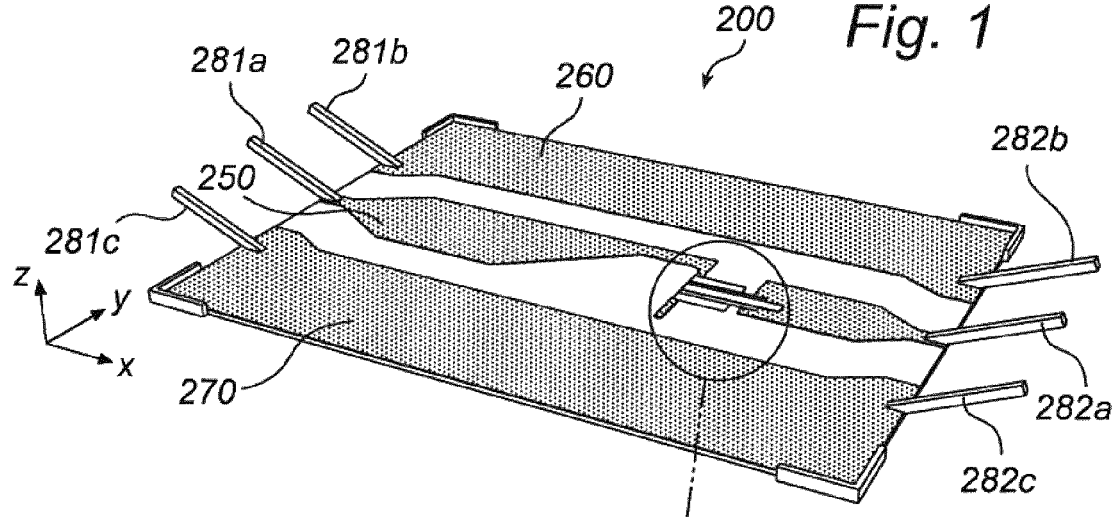
FIG. 2 is a schematic illustration of the diode and a complementary a circuit used for characterizing the diode, which diode is illustrated in FIG. 1.
Figure 2:
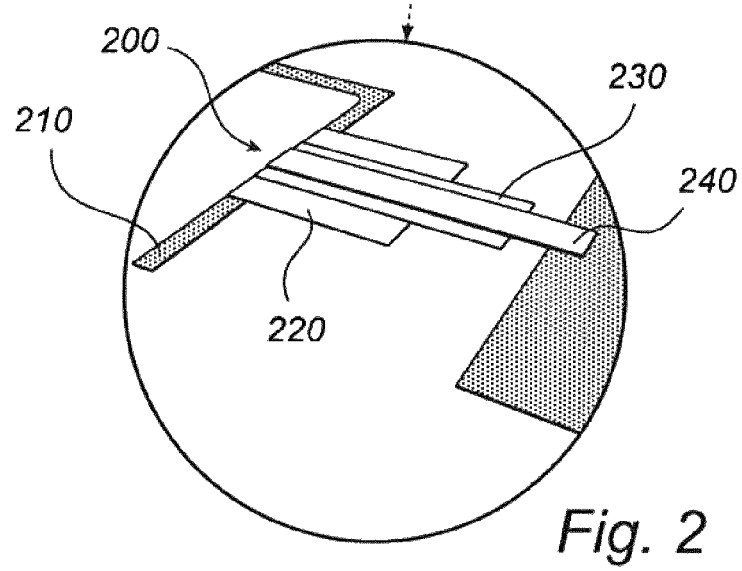

FIG. 2 is a schematic illustration of a diode, manufactured according to the experimental description above, and a complementary circuitry used for electrical characterization of the diode of the invention. The complementary circuitry is rectangular, having two longer sides and two shorter sides. The circuitry comprises a first lateral portion 260, a second lateral portion 270 and a middle portion 250. The two lateral portions 260, 270 and the middle portion 250 all extend substantially in parallel from on of the short sides to the other short side. The purpose of the lateral portions or outer layers 260, 270 are to shield the diode during the high frequency measurement process. Both lateral portions are arranged of aluminum foil, and the middle portion is arranged of aluminum unless stated otherwise below.

The middle portion comprises a diode 200 comprising:
- a first conductor of aluminum, having a tongue 210 with the following measures (100, 2 000, 6). The tongue extends 100 μm in the positive x-direction from x=0.
- a semiconducting layer 220 with the following measures (800, 800, 4) is arranged on top of the first conductor. The semiconducting layer is centered on the tongue in the y-direction, and extends 800 μm in the positive x-direction from x=0;
- a conducting layer 230 with the following measures (1 200, 400, 0.5) is arranged on top of both the semiconductor layer and the first conductor. The conducting layer is centered on the semiconducting layer in the y-direction, and extends 1 200 μm in the positive x-direction from x=0.
- a second electrode of carbon 240 with the following measures (1 500, 200, 10) is arranged on top of the conducting layer. The second electrode is centered on the conducting layer in the y-direction, and extends 1 500 μm in the positive x-direction from x=0.
- a layer of silver having the following measures (1500, 200, 10) is arranged there on. The silver layer is centered on the second electrode in the y-direction, and extends 1500 μm in the positive x-direction from x=0.

All measures are given in μm the directions (x,y,z) in an orthogonal coordinate system.

Figure 3:
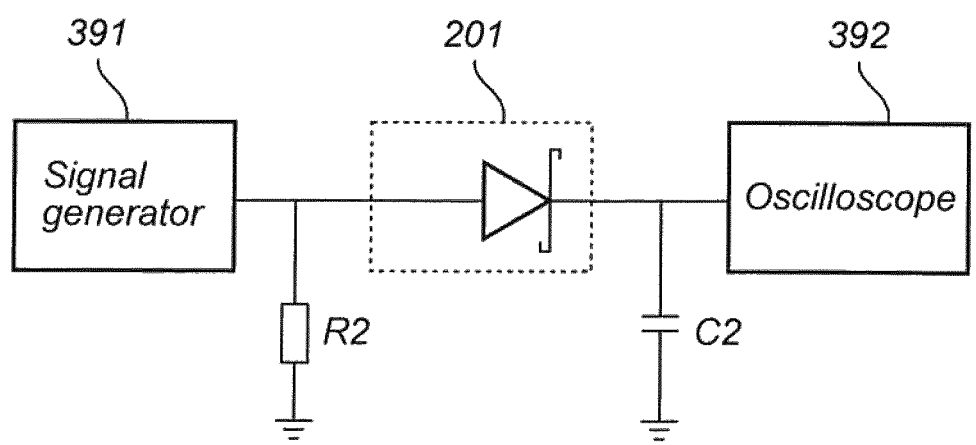
FIG. 3 is a circuit diagram illustrating the measurement set-up used for characterizing the diode

FIG. 3 is a circuit diagram illustrating the measurement set-up used for characterizing the diode. For characterization of the diode, the diode and the complementary circuitry was contacted with two high frequency probes 281, 282, Cascade ACP 40, each probe having one measuring tip 281a, 282a, and two grounding tips 281b, 281c, 282b, 282c, which grounding tips provides a grounding potential. The measuring tips 281a, 282a were connected to the middle layer 250, one tip on each side of the diode. The grounding tips of the first probe 281b, 281c were connected to a respective lateral layer 260, 270 at one end of the complementary circuitry, and the grounding tips of the second probe 282b, 282c were connected to a respective lateral layer 260, 270 at the opposite end of the complementary circuitry.

The circuit described in relation to FIG. 2, is represented by the symbol enclosed in the dashed rectangle 201. The first high frequency probe 281, was connected to the diode as described above, and to a signal generator 391, Agilent 8665B; and the second high frequency probe 282 was connected to the diode as described above, and to a an Oscilloscope 392, Tektronix TDS 3034. A resistance R2 of 50 Ohm was connected to ground at one end, and to the circuit between said signal generator 391 and said diode 200 at the other end. A capacitance C2 of 2.4 nF was connected to ground at one end, and to the circuit between said oscilloscope 392 and said diode 200 at the other end. The diodes were tested by means of RF measurements, which were performed using the signal generator 391, and a measurement set-up as described above. The resulting DC bias level was observed on an oscilloscope. Power levels of the applied RF signal were 18 dBm, 19 dBm, and 20 dBm respectively, and the diodes were tested at the frequencies: 0.1 GHz, 0.5 GHz, 1 GHz, 2 GHz, and 2.45 GHz. The measured DC bias level in V are presented in Table 1.

TABLE 1

Measured DC bias level in V at different Frequencies and input power for one particular diode (Power from Signal Generator ($P_{SG}$)).

| DC-bias level | Signal frequency (GHz) | | | | |
|---|---|---|---|---|---|
| (V) | 0.1 | 0.5 | 1.0 | 2.0 | 2.45 |
| $P_{SG}$ (dBm) 18 | 1.0 | 1.0 | 0.8 | 0.7 | 0.5 |
| 19 | 1.2 | 1.2 | 1.0 | 0.7 | 0.6 |
| 20 | 1.2 | 1.2 | 1.0 | 0.7 | 0.6 |

Figure 4A:
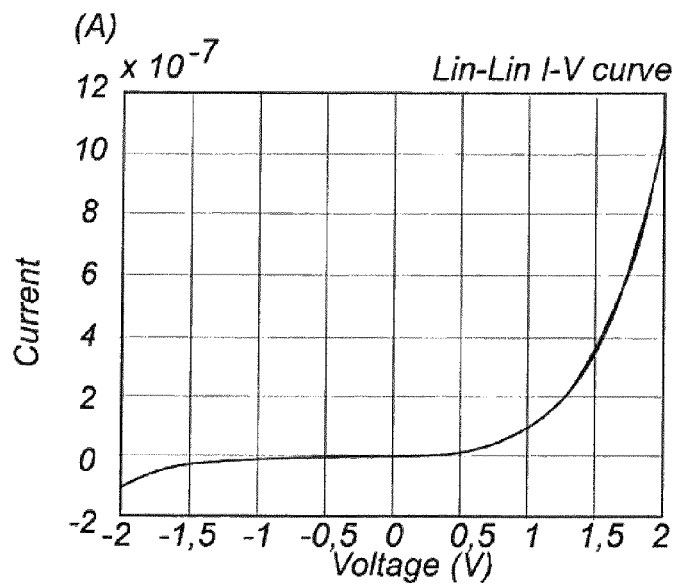
FIG. 4a is a lin-lin diagram of two measurements performed on a diode comprising Al/SU-8+Si/embedded C/Ag.
Figure 4B:
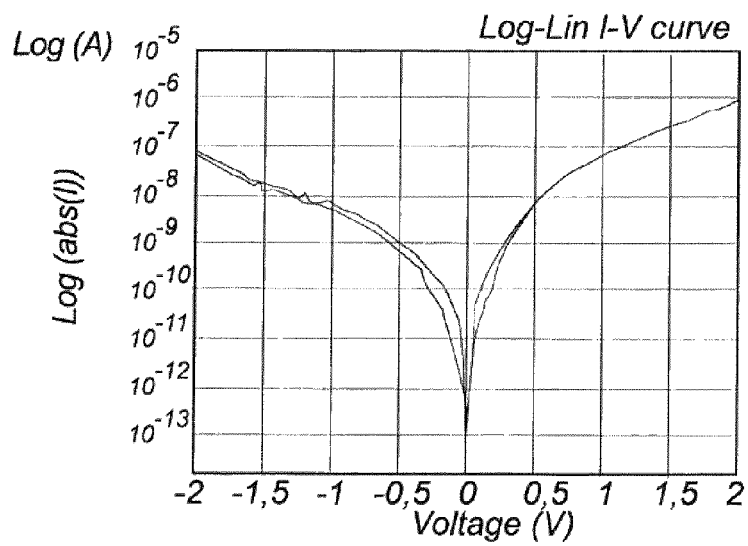
Figure 4C:
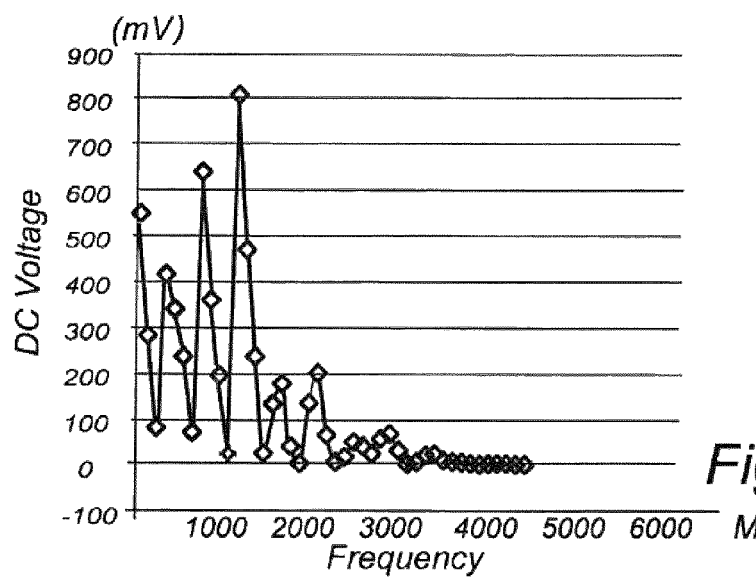
FIG. 4c is a graph showing output DC voltage vs. frequency of the same diode, which measurement results are presented in FIGS. 4a and 4b.

FIG. 4a-4c illustrate the results of measurements made on a component arranged as described above in relation to the section starting with the words: "The printed diodes consist of 6 materials deposited in separating steps on the Al electrode:", except that the NbSi$_2$ has been exchanged for carbon embedded in an inert matrix. In other words the layers are Al/SU-8+Si/embedded C/Ag. FIG. 4a is a lin-lin diagram, and FIG. 4b is a log-lin diagram of the same two diode measurements. FIG. 4c is a graph showing output DC voltage vs. frequency of the same diode. The oscillation is due to a mismatch in the measurement setup. An output voltage can clearly be observed beyond 2 GHz.

By optimizing the diode parameters as discussed above, with respect to e.g. the diode area, a similar response at higher frequencies are obtainable.

The invention has mainly been described above with reference to a number of explicitly disclosed embodiments. However, as is readily appreciated by a person skilled in the art, embodiments other than the ones disclosed above are equally possible within the scope of the invention, as defined by the appended patent claims.

The invention claimed is:

1. A diode comprising:
   a first conductor and a second conductor;
   a semiconducting layer comprising semiconducting material at least partly embedded in an inert matrix, which semiconducting layer is arranged between said first conductor and said second conductor, and
   a conducting layer comprising conducting material at least partly embedded in an inert matrix, which conducting layer is arranged between said semiconducting layer and said second conductor;

wherein:
said layers are stacked on top of each other in a first direction; and
the interface between said first conductor and said semiconducting layer provides a rectifying junction;
the interface between said conducting layer and said semiconducting layer provides a first junction; and
the interface between said second conductor and said conducting layer provides a second junction,
wherein the rectifying junction in operation provides a higher resistance under reversed bias, compared to the total resistance of the rectifying junction and the first and second junctions under forward bias.

2. A diode according to claim 1, wherein the rectifying junction provides a resistance under reversed bias which is at least 2 times higher, preferably at least 5 times higher and more preferably 10 times higher, compared to the total resistance of the rectifying junction and the first and second junctions under forward bias.

3. An electric circuit comprising a diode according to claim 1.

4. Use of a diode according to claim 1 in an electric circuit.

5. A circuitry for application to an article comprising:
an antenna arranged to receive EM-radiation from an external source and to convert the received EM-radiation into electric energy; and
a diode according to claim 1 arranged to receive electric energy from said antenna and convert said energy to a rectified current.

6. A circuitry according to claim 5, wherein:
the circuitry further comprises an indicating device arranged to alter its state in response to said rectified current, wherein said indicating device preferably is a display or a light source, and more preferably a display selected from a group comprising electrochromic displays, e-Ink displays, LCD-displays, bistable displays, capacitive displays, LED-displays, OLED-displays, or combinations thereof or a light source selected from a group comprising LEDs and OLEDs; and/or
the circuitry is arranged to receive and rectify EM-radiation emitted from a wireless device, preferably portable and/or handheld wireless device, more preferably a portable and/or handheld wireless communication device, most preferably a PDA, notebook, electronic reading pad or a mobile telephone; and/or
the diode is arranged to rectify an alternating current having a frequency of between 0.4 and 5 GHz, or between 0.4 GHz and 3 GHz, or between 1 GHz and 3 GHz, or between 1.5 GHz and 2.5 GHz.

7. An article comprising a circuitry according to claim 5, wherein the article is a security document, a smart packaging, an advertising material, a game, a toy, or other type of functional device.

8. A diode comprising:
a first conductor and a second conductor;
a semiconducting layer comprising semiconducting material at least partly embedded in an inert matrix, which semiconducting layer is arranged between said first conductor and said second conductor; and
a conducting layer comprising conducting material at least partly embedded in an inert matrix, which conducting layer is arranged between said semiconducting layer and said second conductor;

wherein:
said layers are stacked on top of each other in a first direction; and
the interface between said first conductor and said semiconducting layer provides a rectifying junction;
the interface between said conducting layer and said semiconducting layer provides a first substantially ohmic junction; and
the interface between said second conductor and said conducting layer provides a second substantially ohmic junction.

9. A diode according to claim 8, wherein:
the rectifying junction in operation provides a higher resistance under reversed bias, compared to the total resistance of the rectifying junction and the first and second substantially ohmic junctions under forward bias; or
the rectifying junction in operation and under reversed bias provides a higher resistance compared to the first and second substantially ohmic junctions.

10. A diode according to claim 8, wherein:
the semiconducting material is selected from group IV or III; or the semiconducting material is selected from group IV or III in mixture with elements selected from group V; or selected from a group consisting of Si, Ge, AlN, AlP, AlAs, GaN, GaP, GaAs, InN, InP and InAs, or wherein the semiconducting material is n- or p-doped silicon; and/or
the conducting material is selected from elements of groups I, III, IV, and VI; or is selected from elements of groups I, III, IV, and VI in mixture with elements of groups I, II, III, IV, V, VI; or is selected from the group consisting of Si, Au, Al, Mo, W, In, AuSn, AuSb, AuGe, AuSi, AuSn, AuTe, AuZn, AlIn, GaAg, InTe, InAu, AgSn, SnTe; or selected from metal silicides; or selected from transition metal silicides; or selected from the group consisting of NbSi2, TiSi2, CoSi2, WSi2, NiSi2, FeSi2, TaSi2, VSi2, or mixtures thereof.

11. A diode according to claim 8, wherein:
the semiconducting material is n-doped or p-doped silicon, and the conducting material comprises silicide; and/or
the first conductor comprises metal, or wherein the first conductor comprises Al, Ag, Cu or combinations thereof; and/or
the second conductor comprises metal, carbon or electrically conductive polymers or combinations thereof, or wherein the second conductor comprises Au, Pedot: PSS, Ag, or combination thereof.

12. A diode according to claim 8, wherein:
the semiconducting material is n-doped silicon, or n-doped silicon which is doped to a degree of 500 µOhm cm to 2 Ohm cm, or to a degree of 0.001 Ohm cm to 0.2 Ohm cm, or to a degree of 0.01 to 0.02 Ohm cm; and/or
the semiconducting material and/or the conducting material are/is arranged in particulate form, preferably particulate form having a particle size of 30 nm to 20 µm, and more preferably a particle size of 1 µm to 10 µm; and/or
both the semiconducting material and the conducting material comprise particles, which particles are arranged in contact with each other so as to provide particle bridges in the inert matrix between the first conductor to the second conductor.

13. A diode according to claim 8, wherein the semiconducting material and/or the conducting material are/is arranged in particulate form, preferably particulate form having a particle size of 30 nm to 20 μm, and more preferably a particle size of 1 μm to 10 μm; and/or both the semiconducting material and the conducting material comprise particles, which particles are arranged in contact with each other so as to provide particle bridges in the inert matrix between the first conductor to the second conductor, and wherein:

the particle size of the semiconducting material is substantially equal to the coarseness of the first conductor, and/or the conducting material particle size is substantially equal to the coarseness of the second conductor; and/or both the semiconducting material and the conducting material are arranged in particulate form, and the semiconducting particles of said semiconducting layer are distributed such that the resistance across the semiconducting layer is lower in said first direction compared to in a second direction being orthogonal to said first direction, and the conducting particles of said conducting layer are distributed such that the resistance across the conducting layer is lower in said first direction compared to in a third direction being orthogonal to said first direction.

14. A diode according to claim 8, wherein both the semiconducting material and the conducting material are arranged in particulate form, and the semiconducting particles of said semiconducting layer are distributed such that the resistance across the semiconducting layer is lower in said first direction compared to in a second direction being orthogonal to said first direction, and the conducting particles of said conducting layer are distributed such that the resistance across the conducting layer is lower in said first direction compared to in a third direction being orthogonal to said first direction, and wherein:

said first conductor overlaps said semiconducting layer, and the semiconducting layer extends, at least along a portion of said first conductor, outside said first conductor in said second direction, and preferably extends outside said first conductor in said second direction along the entire overlap between the first conductor and the semiconducting layer; and/or said second conductor overlaps said conducting layer, and the conducting layer extends, at least along a portion of said second conductor, outside said second conductor in said third direction, and preferably extends outside said second conductor in said third direction along the entire overlap between the second conductor and the conducting layer; and/or the first conductor and the second conductor cross each other at an intersection, and the semiconductor layer and the conducting layer are arranged spatially between the first conductor and the second conductor at said intersection.

15. A diode according to claim 8, wherein both the semiconducting material and the conducting material are arranged in particulate form, and the semiconducting particles of said semiconducting layer are distributed such that the resistance across the semiconducting layer is lower in said first direction compared to in a second direction being orthogonal to said first direction, and the conducting particles of said conducting layer are distributed such that the resistance across the conducting layer is lower in said first direction compared to in a third direction being orthogonal to said first direction, and wherein:

the semiconducting particles of said semiconducting layer are distributed such that the resistance across the semiconducting layer is lower in said first direction compared to in both said second direction and said third direction or in all directions orthogonal to said first direction; and/or the conducting particles of said conducting layer are distributed such that the resistance across the conducting layer is lower in said first direction compared to in both said second direction and said third direction or in all directions orthogonal to said first direction.

16. A diode comprising:
a first conductor and a second conductor;
a semiconducting layer, comprising n-doped or p-doped silicon at least partly embedded in an inert matrix, which semiconducting layer is arranged between said first conductor and said second conductor and in direct contact with said first conductor; and
a silicide layer comprising silicide at least partly embedded in an inert matrix, which silicide layer is arranged between, and in direct contact with, said semiconducting layer and said second conductor.

17. A diode according to claim 16, wherein:
the inert matrix is selected from acrylates, polyurethanes, silicons, preferably the inert matrix is selected from a group comprising epoxy resins, polyalkylenes, or mixtures thereof; and/or
the diode is carried by a flexible substrate, preferably said flexible substrate comprises paper, plastic, or combinations thereof; and/or
the diode is arranged to rectify an alternating current having a frequency of between 0.4 GHz and 5 GHz, or between 0.4 GHz and 3 GHz, or between 1 GHz and 3 GHz, or between 1.5 GHz and 2.5 GHz.

18. A method for manufacturing a diode comprising the following steps:
i) providing a first conductor layer;
ii) applying, on said first conductor layer, a first intermediate layer comprising a first material at least partly embedded in an inert matrix;
iii) solidifying the inert matrix of said first intermediate layer applied in step ii);
iv) applying, on said first intermediate layer, a second intermediate layer comprising a second material at least partly embedded in an inert matrix;
v) solidifying the inert matrix of said second intermediate layer applied in step iv);
vi) providing, on said second intermediate layer, a second conductor layer, such that said layers are stacked on each other in a first direction;
wherein said first material is one of conducting material and semiconducting material; and
said second material is the one of conducting material and semiconducting material, which is different from said first material.

19. A method according to claim 18, wherein:
said step of applying said second intermediate layer comprises the step of applying said third layer on top of both said first conductor and first intermediate layer; and said step of applying a second conductor layer preferably comprises the step of applying said second conductor layer on top of all of said first conductor layer, said first intermediate layer, and said second intermediate layer; and/or
said step of providing said second conductor layer comprises arranging said second conductor layer such that it crosses said first conductor layer at an intersection, and such that said first intermediate layer and said second intermediate layer are arranged between said first conductor layer and said second conductor layer at said intersection.

20. A method according to claim 18, wherein:

said first material is in particulate form and said step of applying said first intermediate layer comprises the step of arranging said first material in said inert matrix such that a portion of said particles is in direct contact with said first conductor layer, and/or such that a portion of said particles are only partly embedded in said inert material; and/or said second material is in particulate form and said step of applying said second intermediate layer comprises the step of arranging said second material in said inert matrix such that a portion of said particles is in direct contact with said second conductor layer, and/or such that a portion of said particles are only partly embedded in said inert material.

21. A method according to claim 20, wherein:

both said first and second materials are in particulate form, said first material comprising a first class of particles, said second material comprising a second class of particles and said step of applying said first intermediate layer further comprises the step of distributing said first class of particles such that the resistance across the first intermediate layer is lower in said first direction compared to in a second direction being orthogonal to said first direction; and/or said step of applying said second intermediate layer further comprises the step of distributing said second class of particles such that the resistance across the second intermediate layer is lower in said first direction compared to a in a third direction being orthogonal to said first direction.

22. A method according to claim 18, wherein:

said step of applying a first intermediate layer further comprises the step of arranging the first intermediate layer such that it extends outside said first conductor layer in a direction being orthogonal to said first direction; and/or said step of providing a second conductor layer further comprises the step of arranging the second conductor layer such that said second intermediate layer extends outside said second conductor layer in a direction being orthogonal to said first direction.

\* \* \* \* \*